(12) United States Patent
Chung et al.

(10) Patent No.: US 11,063,231 B2
(45) Date of Patent: Jul. 13, 2021

(54) LIGHT EMITTING DEVICE AND DISPLAY DEVICE INCLUDING THE SAME

(71) Applicant: SAMSUNG ELECTRONICS CO., LTD., Suwon-si (KR)

(72) Inventors: Dae Young Chung, Suwon-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 103 days.

(21) Appl. No.: 16/593,124

(22) Filed: Oct. 4, 2019

(65) Prior Publication Data

US 2020/0111933 A1    Apr. 9, 2020

(30) Foreign Application Priority Data

Oct. 5, 2018   (KR) ........................ 10-2018-0119326

(51) Int. Cl.
| | |
|---|---|
| *H01L 51/50* | (2006.01) |
| *H01L 33/14* | (2010.01) |
| *H01L 33/06* | (2010.01) |
| *H01L 33/36* | (2010.01) |
| *H01L 51/42* | (2006.01) |

(Continued)

(52) U.S. Cl.
CPC ........ *H01L 51/502* (2013.01); *C09K 11/0811* (2013.01); *C09K 11/0883* (2013.01); *H01L 33/06* (2013.01); *H01L 33/14* (2013.01); *H01L 33/36* (2013.01); *H01L 51/0052* (2013.01); *H01L 51/0071* (2013.01); *H01L 51/4233* (2013.01); *H01L 51/5056* (2013.01); *H01L 51/5072* (2013.01)

(58) Field of Classification Search
None
See application file for complete search history.

(56) References Cited

U.S. PATENT DOCUMENTS

| | | |
|---|---|---|
| 4,065,780 A | 12/1977 | Ballantyne |
| 6,169,296 B1 | 1/2001 | Kamiyama et al. |
| 7,875,874 B2 | 1/2011 | Yoon et al. |

(Continued)

FOREIGN PATENT DOCUMENTS

| | | |
|---|---|---|
| CN | 1152438 C | 6/2004 |
| JP | 2010534933 A | 11/2010 |

(Continued)

*Primary Examiner* — Andres Munoz
(74) *Attorney, Agent, or Firm* — Cantor Colburn LLP

(57) ABSTRACT

An electroluminescent device including an anode and a cathode facing each other, an emission layer disposed between the anode and the cathode, the emission layer including quantum dots, a hole auxiliary layer disposed between the emission layer and the anode and an electron auxiliary layer disposed between the emission layer and the cathode, wherein the electroluminescent device is configured such that electrons are dominant in the emission layer and a logarithmic value (log (HT/ET)) of a hole transport capability (HT) relative to an electron transport capability (ET) is less than or equal to about −1, or the electroluminescent device is configured such that holes are dominant in the emission layer and the logarithmic log value (log (HT/ET)) of the hole transport capability (HT) relative to the electron transport capability (ET) is greater than or equal to about 0.5.

18 Claims, 6 Drawing Sheets

| Cathode |
|---|
| Electron Injection Layer |
| Electron Transport Layer |
| Electron Delay Layer |
| QD Emission Layer |
| Hole Delay Layer |
| Hole Transport Layer |
| Hole Injection Layer |
| Anode |

(51) Int. Cl.
*H01L 51/00* (2006.01)
*C09K 11/08* (2006.01)

(56) References Cited

U.S. PATENT DOCUMENTS

| | | |
|---|---|---|
| 8,629,865 B2 | 1/2014 | Loebl et al. |
| 9,362,445 B2 | 6/2016 | Zhang et al. |
| 10,147,844 B2 | 12/2018 | Kim et al. |
| 2007/0132370 A1 | 6/2007 | Boerner et al. |
| 2010/0213437 A1 | 8/2010 | Akai et al. |
| 2016/0072078 A1* | 3/2016 | Lee .................... H01L 51/0071 257/40 |
| 2019/0198796 A1* | 6/2019 | Kim .................... H01L 51/508 |

FOREIGN PATENT DOCUMENTS

| | | |
|---|---|---|
| KR | 20100083130 A | 7/2010 |
| KR | 1437271 B1 | 9/2014 |
| KR | 1588030 B1 | 2/2016 |
| KR | 20170078928 A | 7/2017 |
| KR | 1777123 B1 | 9/2017 |

* cited by examiner

| Cathode |
| --- |
| Electron Injection Layer |
| Electron Transport Layer |
| QD Emission Layer |
| Hole Delay Layer |
| Hole Transport Layer |
| Hole Injection Layer |
| Anode |

| Cathode |
| Electron Injection Layer |
| Electron Transport Layer |
| Electron Delay Layer |
| QD Emission Layer |
| Hole Delay Layer |
| Hole Transport Layer |
| Hole Injection Layer |
| Anode |

LIGHT EMITTING DEVICE AND DISPLAY DEVICE INCLUDING THE SAME

CROSS-REFERENCE TO RELATED APPLICATION

This application claims priority to and the benefit of Korean Patent Application No. 10-2018-0119326 filed in the Korean Intellectual Property Office on Oct. 5, 2018, and all the benefits accruing therefrom under 35 U.S.C. § 119, the entire contents of which are incorporated herein by reference.

BACKGROUND

1. Field

A light emitting device and a display device are disclosed.

2. Description of the Related Art

Physical characteristics (e.g., energy bandgaps, melting points, etc.) of nanoparticles that are intrinsic characteristics may be controlled by changing the particle sizes of the nanoparticles, unlike bulk materials. For example, semiconductor nanocrystals also known as quantum dots are supplied with photoenergy or electric energy and may emit light in a wavelength corresponding to sizes of the quantum dots. Accordingly, the quantum dots may be used as a light emitting element emitting light of a predetermined wavelength.

SUMMARY

A light emitting device may include quantum dots as a light emitting element. However, the quantum dots are different from a conventional light emitting element, Improvements in performance of light emitting devices including quantum dots is desired.

An embodiment provides a light emitting device capable of exhibiting improved performance.

An embodiment provides a display device including the light emitting device.

According to an embodiment, a light emitting device includes an anode and a cathode spaced from one another (e.g., facing each other), an emission layer disposed between the anode and the cathode, the emission layer including quantum dots, a hole auxiliary layer disposed between the emission layer and the anode, and an electron auxiliary layer disposed between the emission layer and the cathode, wherein the device is configured to have an imbalance between holes and electrons at its operation (e.g., during its operation) whereby the electrons are dominant in the emission layer (e.g., during an initial operating time) and a logarithmic value (log (HT/ET)) of a hole transport capability (HT) measured in milliamperes per square centimeter (mA/cm$^2$) relative to an electron transport capability (ET) measured in mA/cm$^2$ is less than or equal to about −1, or the device is configured such that holes are dominant in the emission layer (e.g., during an initial operating time) and the logarithmic value (log (HT/ET)) of the hole transport capability (HT) measured in mA/cm$^2$ relative to electron transport capability (ET) measured in mA/cm$^2$ is greater than or equal to about 0.5.

The logarithmic value (log (HT/ET)) of the hole transport capability (HT) measured in mA/cm$^2$ relative to the electron transport capability (ET) measured in mA/cm$^2$ may be less than or equal to about −2.

The logarithmic value (log (HT/ET)) of the hole transport capability (HT) measured in mA/cm$^2$ relative to the electron transport capability (ET) measured in mA/cm$^2$ may be greater than or equal to about −5.

The logarithmic value (log (HT/ET)) of the hole transport capability (HT) measured in mA/cm$^2$ relative to the electron transport capability (ET) measured in mA/cm$^2$ may be greater than or equal to about −4.

The hole auxiliary layer may include a first hole transport layer (e.g., directly) adjacent to the emission layer.

A highest occupied molecular orbital (HOMO) energy level difference between the first hole transport layer and the emission layer may be greater than about 0.1 electronvolts (eV).

A highest occupied molecular orbital (HOMO) energy level difference between the first hole transport layer and the emission layer may be greater than about 0.3 electronvolts (eV).

A HOMO energy level difference between the first hole transport layer and the emission layer may be greater than or equal to about 0.5 eV.

A hole mobility of the first hole transport layer may be less than about 0.01 square centimeters per volt second (cm$^2$/Vs).

A hole mobility of the first hole transport layer may be less than or equal to about 0.001 cm$^2$/Vs.

The first hole transport layer may include a polymer including a substituted or unsubstituted fluorene moiety.

The polymer including the fluorene moiety may be a copolymer including a substituted or unsubstituted fluorene moiety in the main chain.

The copolymer may further include a divalent aromatic moiety in addition to the fluorene moiety.

The polymer including the fluorene moiety may include a *—RN(R$_1$)—* group (wherein, R is a direct bond, a divalent substituted or unsubstituted aromatic hydrocarbon group, a divalent substituted or unsubstituted aliphatic hydrocarbon group, or a combination thereof, R$_1$ is a monovalent organic group, and * is a linking point with an adjacent atom) in the main chain.

The fluorene moiety may be substituted with a monovalent C1 to C40 substituted or unsubstituted aliphatic hydrocarbon group, a monovalent C5 to C40 substituted or unsubstituted aromatic hydrocarbon group, or a combination thereof.

The logarithmic value (log (HT/ET)) of the hole transport capability (HT) measured in mA/cm$^2$ relative to the electron transport capability (ET) measured in mA/cm$^2$ may be greater than or equal to about 1.

The logarithmic value (log (HT/ET)) of the hole transport capability (HT) measured in mA/cm$^2$ relative to the electron transport capability (ET) measured in mA/cm$^2$ may be less than or equal to about 4.

The logarithmic value (log (HT/ET)) of a hole transport capability (HT) measured in mA/cm$^2$ relative to electron transport capability (ET) measured in mA/cm$^2$ may be less than or equal to about 3.5.

The logarithmic value (log (HT/ET)) of a hole transport capability (HT) measured in mA/cm² relative to electron transport capability (ET) measured in mA/cm² may be less than or equal to about 3.

The emission layer may further include a halogen.

The emission layer may further include a chlorine.

A content of an organic material of the emission layer may be less than about 20 weight percent (wt %), based on a total weight of the emission layer.

A content of an organic material of the emission layer may be less than or equal to about 15 wt %, based on a total weight of the emission layer. A content of an organic material of the emission layer may be less than or equal to about 12 wt %, based on a total weight of the emission layer. A content of an organic material of the emission layer may be less than or equal to about 10 wt %, based on a total weight of the emission layer.

The quantum dots may include quantum dots that are surface-treated with a metal halide.

The electron auxiliary layer may include a first electron transport layer (e.g., directly) adjacent to the emission layer.

The first electron transport layer may include an organic material.

An electron mobility of the first electron transport layer may be less than or equal to about 0.01 cm²/Vs.

An electron mobility of the first electron transport layer may be less than or equal to about 0.005 cm²/Vs.

The organic material may include a compound including at least one (or at least two) polycyclic aromatic moiety, a compound including a heteroaromatic ring, or a combination thereof.

The organic material may include a compound including at least two of an anthracene moiety, a naphthalene moiety, and/or a phenylene moiety, a pyrazole compound, or a combination thereof.

The first electron transport layer may include nanoparticles including zinc metal oxide.

The zinc metal oxide may include a compound represented by Chemical Formula 1:

                  Chemical Formula 1

In Chemical Formula 1, M is Mg, Ca, Zr, W, Li, Ti, Y, Al, or a combination thereof, and $0 \leq x \leq 0.5$.

The device may be configured to have a life-span-luminance curve having a (local) maximum.

The (local) maximum may be at least 1.05 times as large as an initial luminance of the device.

The (local) maximum may be at least 1.1 times as large as the initial luminance of the device.

The (local) maximum may be at least 1.2 times as large as the initial luminance of the device.

When the electroluminescent device is deteriorated to show about 40% of an initial luminance thereof, a photoluminescence intensity (ratio) at a maximum peak wavelength of the electroluminescent device may be less than or equal to about 0.5 relative to an initial value of a photoluminescence intensity of the electroluminescent device.

When the electroluminescent device is deteriorated to show about 40% of an initial luminance thereof, a photoluminescence intensity (ratio) at a maximum peak wavelength of the electroluminescent device may be less than or equal to about 0.4 relative to an initial value of a photoluminescence intensity of the electroluminescent device.

An embodiment provides a display device including the aforementioned light emitting device.

According to an embodiment, efficiency and life-span of the electroluminescent device may be simultaneously improved.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figures 1, 2:
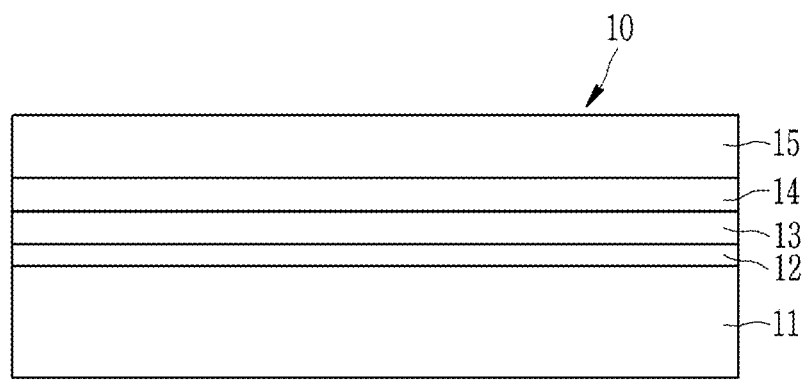
FIG. 1 is a schematic cross-sectional view of a quantum dot (QD) light emitting diode (LED) device according to an embodiment.
FIG. 2 is a schematic cross-sectional view of a QD LED device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function or a (HOMO or LUMO) energy level is expressed as an absolute value from a vacuum level. In addition, when the work function or the energy level is referred to be "deep," "high" or "large," the work function or the energy level has a large absolute value based on "0 eV" of the vacuum level, while when the work function or the energy level is referred to be "shallow," "low," or "small," the work function or energy level has a small absolute value based on "0 eV" of the vacuum level.

As used herein, "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, when a definition is not otherwise provided, "substituted" refers to replacement of hydrogen of a compound, a group, or a moiety by a C1 to C30 alkyl group, a C2 to C30 alkenyl group, a C2 to C30 alkynyl group, a C2 to C30 epoxy group, a C2 to C30 alkenyl group, a C2 to C30 alkyl ester group, a C3 to C30 alkenyl ester group (e.g., an acrylate group, a methacrylate group), a C6 to C30 aryl group, a C7 to C30 alkylaryl group, a C1 to C30 alkoxy group, a C1 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a thiocyanate group (—SCN), a cyano group (—CN), an amino group (—NRR' wherein R and R' are independently hydrogen or a C1 to C6 alkyl group), an azido group (—N3), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, a hydrocarbon group refers to a group including carbon and hydrogen (e.g., alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

As used herein, when a definition is not otherwise provided, "alkyl" refers to a linear or branched saturated monovalent hydrocarbon group (methyl, ethyl hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aryl" refers to a group formed by removal of at least one hydrogen from an aromatic group (e.g., phenyl or naphthyl group).

As used herein, when a definition is not otherwise provided, "hetero" refers to one including 1 to 3 heteroatoms of N, O, S, Si, P, or a combination thereof.

As used herein, when a definition is not otherwise provided, "heteroaryl" refers to an aromatic group that comprises at least one heteroatom covalently bonded to one or more carbon atoms of aromatic ring.

Quantum dots may be next generation display materials as they may provide high color reproducibility and solution processability. Since both triplet and singlet excitons can participate in their luminescence, quantum dots may exhibit an improved level of luminescence efficiency. However, a quantum dot-based light emitting diode may experience degradation problems. In an embodiment, a quantum dot-based electroluminescent device having a structure capable of exhibiting an extended life-span is provided.

In a device according to an embodiment, the emission layer is configured to have a charge imbalance state (i.e., a state in which one of the holes and electrons is dominant e.g., in their number) in a certain level or more thereinside. In a device according to an embodiment, an overshoot of luminance occurs when a device driving time has elapsed. As used herein, "overshoot" refers to a generation of a value that exceeds an initial luminance value at a predetermined level (for example, 1.1 times of the initial value) as a time has elapsed. Thus, an extended life-span according to an embodiment may be exhibited.

FIG. 1 is a schematic cross-sectional view of a light emitting device according to an embodiment.

Referring to FIG. 1, a light emitting device 10 according to an embodiment includes an anode 11 and a cathode 15 facing each other, an emission layer 13 disposed between the anode 11 and the cathode 15 and including quantum dots, a hole auxiliary layer disposed between the emission layer and the anode 12, and an electron auxiliary layer disposed between the emission layer and the cathode 14, wherein the device is configured to have an imbalance between electrons and holes in the emission layer (e.g., on its operation or at least during its initial operation).

Due to the imbalance between electrons and holes, when the device is, for example, configured so that electrons are dominant in the emission layer during an initial operating time, a logarithmic value (log (HT/ET)) of a hole transport capability (HT), for example, measured in mA/cm$^2$ at a predetermined voltage (e.g., from about 4 volts to about 12 volts or at 8 V), relative to electron transport capability (ET), for example, measured in mA/cm$^2$ at a predetermined voltage (e.g., from about 4 volts to about 12 volts or at 8 V), is less than or equal to about −1. When the device is configured so that holes are dominant in the emission layer (e.g., during an initial operating time), the device has a logarithmic value (log (HT/ET)) of a hole transport capability (HT), for example, measured in mA/cm$^2$ at a predetermined voltage (e.g., from about 4 volts to about 12 volts or at 8 V), relative to electron transport capability (ET), for example, measured in mA/cm$^2$ at a predetermined voltage (e.g., from about 4 volts to about 12 volts or at 8 V), of greater than or equal to about 0.5.

The light emitting device may further include a substrate. The substrate may be disposed at the side of the anode 11 or the cathode 15. In an embodiment, the substrate may be disposed at the side of the anode. The substrate may be a substrate including an insulation material (e.g., insulating transparent substrate). The substrate may include glass; various polymers such as polyester (e.g., polyethylene terephthalate (PET), polyethylene naphthalate (PEN)), polycarbonate, polyacrylate, polyimide, and polyamideimide; polysiloxane (e.g., PDMS); inorganic materials such as $Al_2O_3$ and ZnO; or a combination thereof, but is not limited thereto. The substrate may be made of a silicon wafer, and the like. Herein "transparent" may refer to transmittance for light in a predetermined wavelength (e.g., light emitted from the quantum dots) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected taking into consideration a substrate material, and the like but is not particularly limited. The transparent substrate may have flexibility. The substrate may be omitted.

The anode 11 and the cathode 15 may be made of a conductor, for example a metal, a conductive metal oxide, or a combination thereof. The anode 11 may be for example made of a metal such as nickel, platinum, vanadium, chromium, copper, zinc, gold, or an alloy thereof; a conductive metal oxide such as zinc oxide, indium oxide, tin oxide, indium tin oxide (ITO), indium zinc oxide (IZO), or fluorine doped tin oxide; or a combination of metal and oxide such as ZnO and Al or $SnO_2$ and Sb; and the like, but is not limited thereto.

The cathode 15 may be made of a conductor, for example a metal, a conductive metal oxide, a conductive polymer, or a combination thereof. The cathode 15 may be for example a metal such as aluminum, magnesium, calcium, sodium, potassium, titanium, indium, yttrium, lithium, gadolinium, silver, gold, platinum, tin, lead, cesium, or barium or an alloy thereof; a multi-layer structured material such as LiF/Al, $Li_2O$/Al, Liq/Al, LiF/Ca, or $BaF_2$/Ca, but is not limited thereto. The conductive metal oxide is the same as described above.

In an embodiment, the anode, the cathode, or a combination thereof may include a transparent conductive metal oxide, for example, indium tin oxide. A work function of the anode may be higher than a work function of the cathode. A work function of the anode may be lower than a work function of the cathode.

In an embodiment, a work function of the anode 11 may be for example greater than or equal to about 4.5 eV and less than or equal to about 5.0 eV (e.g., about 4.6 eV to about 4.9 eV) and a work function of the cathode 15 may be for example greater than or equal to about 4.0 eV and less than or equal to about 4.5 eV (e.g., about 4.0 eV to about 4.35 eV). In an embodiment, a work function of the cathode 15 may be for example greater than or equal to about 4.5 eV and less than or equal to about 5.0 eV (e.g., about 4.6 eV to about 4.9 eV) and a work function of the anode 11 may be for example greater than or equal to about 4.0 eV and less than or equal to about 4.5 eV (e.g., about 4.0 eV to about 4.35 eV) or greater than or equal to about 4.6 eV and less than or equal to about 5.2 eV.

In an embodiment, a work function of the anode may be higher than a work function of the cathode. In an embodiment, a work function of the anode may be lower than a work function of the cathode.

The anode 11, the cathode 15, or a combination thereof may be a light-transmitting electrode, and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the anode 11 and cathode 15 is a non-light-transmitting electrode, the non-light-transmitting electrode may be made of for example an opaque conductor such as aluminum (Al), silver (Ag), or gold (Au).

A thickness of the anode, the cathode, or a combination thereof is not particularly limited and may be appropriately selected taking into consideration device efficiency. For example, the thickness of the electrodes may be greater than or equal to about 5 nanometers (nm), for example, greater than or equal to about 50 nm. For example, the thickness of the electrodes may be less than or equal to about 100 micrometers (μm), for example, less than or equal to about 10 μm, less than or equal to about 1 μm, less than or equal to about 900 nm, less than or equal to about 500 nm, or less than or equal to about 100 nm.

The emission layer 13 includes quantum dots. The emission layer 13 has a first surface facing the hole auxiliary layer, and a second surface opposed to the first surface and facing the electron auxiliary layer.

The quantum dots are nano-sized semiconductor nanocrystal particles and may exhibit quantum confinement effects. The quantum dots may include a Group II-VI compound, a Group III-V compound, a Group IV-VI compound, a Group IV element or compound, a Group I-III-VI compound, a Group II-III-VI compound, a Group I-II-IV-VI compound, or a combination thereof.

The Group II-VI compound may be a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. The Group II-VI compound may further include a Group III metal. The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, or a combination thereof; or a combination thereof. The Group III-V compound may further include a Group II metal (e.g., InZnP). The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof. Examples of the Group compound may include $CuInSe_2$, $CuInS_2$, CuInGaSe, and CuInGaS, but are not limited thereto. Examples of the Group I-II-IV-VI compound may include CuZnSnSe and CuZnSnS, but are not limited thereto. The Group IV element or compound may be a single element such as Si, Ge, and a mixture thereof; a binary element compound such as SiC, SiGe, or a combination thereof; or a combination thereof.

In an embodiment, the quantum dots may not include a heavy metal (e.g., cadmium, lead, mercury, or a combination thereof). For example, the quantum dots may include, for example, semiconductor nanocrystals including a Group III-V compound including indium and phosphorus in a core thereof, a shell thereof, or a combination thereof. The Group III-V compound may further include zinc. The quantum dot may include a semiconductor nanocrystal including a Group II-VI compound including a chalcogen element (e.g., sulfur, selenium, tellurium, or a combination thereof) and zinc in a core thereof, a shell thereof, or a combination thereof.

In the quantum dots, the aforementioned binary element compound, ternary element compound, quaternary element compound, or a combination thereof respectively may exist in a uniform concentration in the semiconductor nanocrystal particles or partially different concentrations in the same particles. The semiconductor nanocrystals may have a core/shell structure wherein a first semiconductor nanocrystal (core) surrounds another second semiconductor nanocrystal (shell) having the same or different composition. In an embodiment, the quantum dots may include a core including the aforementioned compounds (i.e., Group II-VI compound, Group III-V compound, Group IV-VI compound, Group IV element or compound, Group I-III-VI compound, Group II-III-VI compound, Group I-II-IV-VI compound, or a combination thereof) and a shell having a different composition from the core and including the aforementioned compounds. The core may include InP, InZnP, ZnSe, ZnSeTe, or a combination thereof. The shell may include InP, InZnP, ZnSe, ZnS, ZnSeTe, ZnSeS, or a combination thereof. The shell may include a multi-layered shell having at least two layers. The shell may include Zn, Se, and optionally S (e.g., directly) on the core. The shell may include zinc and sulfur in the outermost layer.

The core and the shell may have an interface, and an element of the core, the shell, or a combination thereof in the interface may have a concentration gradient wherein the concentration of the element(s) of the shell decreases toward the core. The semiconductor nanocrystal may have a structure including one semiconductor nanocrystal core and a multi-layered shell surrounding the same. Herein, the multi-layered shell has at least two shells wherein each shell may have a single composition, an alloy, or a concentration gradient.

In the quantum dots, the shell material and the core material may have different energy bandgaps from each other. For example, the energy bandgap of the shell material may be greater than that of the core material. According to an embodiment, the energy bandgap of the shell material may be less than that of the core material. The quantum dot may have a multi-layered shell. In the multi-layered shell, the energy bandgap of the outer layer may be greater than the energy bandgap of the inner layer (i.e., the layer nearer, e.g., closer, to the core). In the multi-layered shell, the energy bandgap of the outer layer may be less than the energy bandgap of the inner layer.

In an embodiment, the quantum dots may include a core including a first semiconductor nanocrystal including indium, phosphorus, and optionally zinc and a shell disposed on the core and including a second semiconductor nanocrystal including zinc and a chalcogen element. In an embodiment, the quantum dots may include a core including a first semiconductor nanocrystal including zinc, selenium, and optionally tellurium and a shell disposed on the core and including a second semiconductor nanocrystal including zinc and a chalcogen element.

The quantum dots may have a particle size of greater than or equal to about 1 nm and less than or equal to about 100 nm. The quantum dots may have a particle size (e.g., an average diameter or an average equivalent diameter) of about 1 nm to about 20 nm, for example, greater than or equal to about 2 nm, greater than or equal to about 3 nm, or greater than or equal to about 4 nm and less than or equal to about 50 nm, less than or equal to about 40 nm, less than or equal to about 30 nm, less than or equal to about 20 nm, less than or equal to about 15 nm, less than or equal to about 10 nm, less than or equal to about 9 nm, or less than or equal to about 8 nm. The shape of the quantum dots is not particularly limited. For example, the shapes of the quantum dots may be a sphere, a polyhedron, a pyramid, a multipod, a square, a rectangular parallelepiped, a nanotube, a nanorod, a nanowire, a nanosheet, or a combination thereof, but is not limited thereto.

The aforementioned quantum dots may be commercially available or appropriately synthesized.

In the light emitting device according to an embodiment, the quantum dots may include a first organic ligand on the surface of the quantum dots. The first organic ligand may have a hydrophobic moiety. The first organic ligand may be bound to the surfaces of the quantum dots. The first organic ligand may include RCOOH, RNH$_2$, R$_2$NH, R$_3$N, RSH, R$_3$PO, R$_3$P, ROH, RCOOR, RPO(OH)$_2$, RHPOOH, R$_2$POOH, or a combination thereof, wherein each R is independently a C3 to C40 or a C5 to C40 substituted or unsubstituted aliphatic hydrocarbon group such as a C3 to C40 alkyl or alkenyl, a C6 to C40 substituted or unsubstituted aromatic hydrocarbon group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compound such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, or trioctyl amine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, diphenyl phosphine, triphenyl phosphine, or trioctyl phosphine; a phosphine oxide compound such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, diphenyl phosphine oxide, triphenyl phosphine oxide, or trioctyl phosphine oxide; a C5 to C20 alkyl phosphinic acid such as hexyl phosphinic acid, octyl phosphinic acid, dodecane phosphinic acid, tetradecane phosphinic acid, hexadecane phosphinic acid, octadecane phosphinic acid; an alkylphosphonic acid such as a C5 to C20 alkylphosphonic acid; and the like, but are not limited thereto. The quantum dots may include the organic ligand that is the same, or a mixture of at least two different hydrophobic organic ligands.

In the emission layer, an absorption/emission wavelength of the quantum dots may be controlled by adjusting a composition and a size thereof. A maximum peak emission wavelength of the quantum dot may be in a range of ultraviolet (UV) to infrared or greater. For example, the maximum peak emission wavelength of the quantum dot may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum peak emission wavelength of the quantum dot may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum peak emission wavelength of the quantum dots may be in the range of about 500 nm to about 650 nm. For example, the maximum peak emission wavelength of the quantum dots may be in the range of about 500 nm to about 550 nm (e.g., green). For example, the maximum peak emission wavelength of the quantum dots may be in the range of about 600 nm to about 650 nm (e.g., red).

The quantum dots may have (electroluminescence or photoluminescence) quantum efficiency of greater than or equal to about 10%, for example, greater than or equal to about 30%, greater than or equal to about 50%, greater than or equal to about 60%, greater than or equal to about 70%, greater than or equal to about 90%, or about 100%. The quantum dots may have a relatively narrow emission spectrum. A (electro- or photo-) emission spectrum of the quantum dots may have for example a full width at half maximum (FWHM) of less than or equal to about 50 nm, for example less than or equal to about 45 nm, less than or equal to about 40 nm, less than or equal to about 35 nm, or less than or equal to about 30 nm.

The emission layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm. The emission layer 13 may have for example a thickness of about 10 nm to about 150 nm, for example about 10 nm to about 100 nm or about 10 nm to about 50 nm.

The emission layer 13 may have a HOMO energy level of greater than or equal to about 5.4 eV, greater than or equal to about 5.6 eV, greater than or equal to about 5.7 eV, greater than or equal to about 5.8 eV, greater than or equal to about 5.9 eV, or greater than or equal to about 6.0 eV. The emission layer 13 may have a HOMO energy level of less than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. In an embodiment, the emission layer 13 may have a HOMO energy level of about 5.5 eV to about 6.1 eV. The emission layer 13 may have for example a lowest unoccupied molecular orbital (LUMO) energy level of less than or equal to about 3.95 eV, less than or equal to about 3.8 eV, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The emission layer 13 may have an LUMO energy level of greater than or equal to about 2.5 eV, for example, greater than or equal to about 2.6 eV, greater than or equal to about 2.7 eV, or greater than or equal to about 2.8 eV. In an embodiment, the emission layer 13 may have an energy bandgap of about 2.4 eV to about 3.6 eV.

The device according to an embodiment is configured to cause an imbalance between electrons and holes in the emission layer 13. Herein, imbalance between electrons and holes means that either one of electrons and holes is dominant in terms of, for example, number, e.g., quantity. Thus, the device according to an embodiment may be configured such that electrons are dominant (e.g., there are less holes than electrons) or holes are dominant (e.g., there are less electrons than holes) in the emission layer 13 (e.g., during at least initial operating time).

In an embodiment, when the emission layer is configured such that there are less holes than electrons included (i.e., electrons are dominant) during at least initial operating time (hereinafter, also referred to as a hole minority device), the logarithmic value (log (HT/ET)) of a hole transport capability (HT), for example, measured in mA/cm$^2$ at a predetermined voltage (e.g., from about 4 V to about 12 V, or at about 8 V), relative to electron transport capability (ET), for example, measured in mA/cm$^2$ at a predetermined voltage (e.g., from about 4 V to about 12 V, or at about 8 V), may be less than or equal to about −1. The HT/ET is less than about 1, and the logarithmic value of HT/ET may have a negative value.

The electron transport capability may be obtained from a graph of the current density with respect to the voltage of a suitable electron only device (hereinafter referred to as EOD). A structure of the EOD may be an electrode/a lower electron auxiliary layer (electron injection layer, electron transport layer (ETL), or a combination thereof)/a quantum dot/an upper electron auxiliary layer (electron injection layer, electron transport layer, or a combination thereof)/an electrode (e.g., ITO/ZnMgO 30-50 nm/QD 20-30 nm/ZnMgO 30-50 nm/Al 100 nm).

The electron (or hole) transport capability may be measured at a voltage of greater than or equal to about 4 volts, greater than or equal to about 5 volts, greater than or equal to about 6 volts, greater than or equal to about 7 volts, greater than or equal to about 8 volts, greater than or equal to about 9 volts, or greater than or equal to about 10 volts and less than or equal to about 12 volts, less than or equal to about 11 volts, less than or equal to about 10 volts, less than or equal to about 9 volts, less than or equal to about 8 volts, or less than or equal to about 7 volts. The electron (or hole) transport capability may be measured at a voltage of about 8 volts.

The materials of the upper electron auxiliary layer, lower electron auxiliary layer, or a combination thereof may include the same materials as used materials in the device to be measured. The materials of the upper electron auxiliary layer, lower electron auxiliary layer, or a combination thereof may include different materials as used materials in the device to be measured.

The hole transport capability may be obtained from a graph of the current density with respect to the voltage of a suitable hole only device (hereinafter referred to as HOD). The HOD for measuring the hole transport capability may have a structure wherein an electrode/a lower hole auxiliary layer (e.g., hole injection (delay) layer, hole transport layer (HTL), or a combination thereof)/a quantum dot emission layer/an upper hole auxiliary layer (e.g., hole injection layer, hole transport layer, or a combination thereof)/an electrode (for a non-limiting example, having a structure of ITO/poly (3,4-ethylenedioxythiophene)polystyrene sulfonate (PEDOT:PSS) 30 nm/poly(9,9-dioctyl-fluorene-co-N-(4-butylphenyl)-diphenylamine) (TFB) 25 nm/QD 20-30 nm/GSH0137 (a compound including a Bi-carbazole and a Bi phenyl series) 36 nm/dipyrazino[2,3-f:2',3'-h]quinoxaline-2,3,6,7,10,11-hexacarbonitrile (HAT-CN) 10 nm/Ag 100 nm). The materials of the upper hole auxiliary layer, lower hole auxiliary layer, or a combination thereof may include the same materials as used materials in the device to be measured. The materials of the upper hole auxiliary layer, lower hole auxiliary layer, or a combination thereof may include different materials as used materials in the device to be measured.

The hole/electron transport capability may be a value at a predetermined voltage (e.g., 8 volts (V)) or measured at a voltage of greater than or equal to about 4 volts, greater than or equal to about 5 volts, greater than or equal to about 6 volts, greater than or equal to about 7 volts, greater than or equal to about 8 volts, greater than or equal to about 9 volts, and greater than or equal to about 10 volts and less than or equal to about 12 volts, less than or equal to about 11 volts, less than or equal to about 10 volts, less than or equal to about 9 volts, less than or equal to about 8 volts, or less than or equal to about 7 volts.

For example, the HT and ET measurement values are measured by a predetermined number of times (e.g., three times) at a predetermined voltage interval (e.g., from −2 V to 8 V intervals) at a predetermined rate (e.g., 0.2 V unit). The HT and ET values measured three times at a predetermined voltage (e.g., maximum voltage, for example, 8 V) may be selected.

When a device is configured to show a hole minority (e.g., less holes than electrons) in the emission layer, the logarithmic value (log (HT/ET)) of a hole transport capability (HT), for example, measured in mA/cm$^2$, relative to electron transport capability (ET), for example, measured in mA/cm$^2$, may be less than or equal to about −1.5, less than or equal to about −1.6, less than or equal to about −1.7, less than or equal to about −1.8, less than or equal to about −1.9, less than or equal to about −2, less than or equal to about −2.1, less than or equal to about −2.2, less than or equal to about −2.3, less than or equal to about −2.4, less than or equal to about −2.5, less than or equal to about −2.6, less than or equal to about −2.7, less than or equal to about −2.8, less than or equal to about −2.9, or less than or equal to about −3. When the device is configured to show the hole minority in the emission layer, the logarithmic value (log (HT/ET)) of a hole transport capability (HT), for example, measured in mA/cm$^2$, relative to electron transport capability (ET), for example, measured in mA/cm$^2$, may be greater than or equal to about −5, for example, greater than or equal to about −4.9, greater than or equal to about −4.8, greater than or equal to about −4.7, greater than or equal to about −4.6, greater than or equal to about −4.5, greater than or equal to about −4.4, greater than or equal to about −4.3, greater than or equal to about −4.2, greater than or equal to about −4.1, or greater than or equal to about −4.0. When the device is configured to show the hole minority in the emission layer, the logarithmic value (log (HT/ET)) of a hole transport capability (HT), for example, measured in mA/cm$^2$, relative to electron transport capability (ET), for example, measured in mA/cm$^2$, may be about −3 to about −4. In this case, the HT may be less than or equal to about 1 mA/cm$^2$, less than or equal to about 0.5 mA/cm$^2$, less than or equal to about 0.1 mA/cm$^2$, less than or equal to about 0.05 mA/cm$^2$. The HT may be greater than or equal to about 0.005 mA/cm$^2$, The ET may be less than or equal to about 10 mA/cm$^2$, less than or equal to about 9 mA/cm$^2$, less than or equal to about 8 mA/cm$^2$, less than or equal to about 7 mA/cm$^2$. The ET may be greater than or equal to about 1 mA/cm$^2$. Without being bound by any particular theory, in the device having a hole minority, e.g., fewer holes than electrons, a recombination of electrons and holes may be formed closer to the interface between the emission layer and the hole transporting layer. When a device driving time has elapsed, a hole/electron recombination region gradually moves toward the center of the luminescence region, and therefore, the exciton extinction at the interface may be relaxed, which may lead to an increase in device efficiency. In an embodiment, the device may exhibit overshoot as described later.

In an embodiment, when in the emission layer, holes are dominant (that is, electrons are minor, e.g., less electrons than holes, hereinafter, also referred to as an electron minority device) during its operation time (e.g., at least initial operating time), the logarithmic value (log (HT/ET)) of a hole transport capability (HT), for example, measured in mA/cm$^2$, relative to electron transport capability (ET), for example, measured in mA/cm$^2$, may be greater than or equal to about 0.5, for example, greater than or equal to about 0.6, greater than or equal to about 0.7, greater than or equal to about 0.8, greater than or equal to about 0.9, greater than or equal to about 1, greater than or equal to about 1.5, or greater than or equal to about 2. In the electron minority device, the logarithmic value (log (HT/ET)) of a hole transport capability (HT), for example, measured in mA/cm$^2$, relative to electron transport capability (ET), for example, measured in mA/cm$^2$, may be less than or equal to about 4, for example, less than or equal to about 3.9, less than or equal to about 3.8, less than or equal to about 3.7, less than or equal to about 3.6, less than or equal to about 3.5, less than or equal to about 3.4, less than or equal to about 3.3, less than or equal to about 3.2, less than or equal to about 3.1, or less than or equal to about 3. In the electron minority device, the logarithmic value (log (HT/ET)) of a hole transport capability (HT), for example, measured in mA/cm$^2$, relative to electron transport capability (ET), for example, measured in mA/cm$^2$, may be about 1 to about 3. In this case, the HT may be greater than or equal to about 10 mA/cm$^2$, or greater than or equal to about 50 mA/cm$^2$, or greater than or equal to about 100 mA/cm$^2$. The HT may be less than or equal to about 300 mA/cm$^2$, less than or equal to about 200 mA/cm$^2$, less than or equal to about 180 mA/cm$^2$, less than or equal to about 170 mA/cm$^2$. The ET may be less than or equal to about 10 mA/cm$^2$, less than or equal to about 9 mA/cm$^2$, less than or equal to about 8 mA/cm$^2$, less than or equal to about 7 mA/cm$^2$. The ET may be greater than or equal to about 1 mA/cm$^2$.

Without being bound by any particular theory, in the electron minority device, a recombination of electrons and holes may be formed closer to the interface between the emission layer and the electron auxiliary layer. In the device, when a device driving time has elapsed, an electron/hole recombination region gradually moves toward the center of the luminescence region, and therefore, the exciton extinction at the interface may be relaxed, which may lead to an increase in device efficiency. In an embodiment, the electron minority device may exhibit overshoot as described later.

In the electron minority device, the emission layer may have greatly increased hole transport capability and may exhibit hole dominance. In an embodiment, quantum dots included in the emission layer of the electron minority device may have a decreased amount of an organic material (e.g., organic ligand), include a halogen (F, Cl, Br, I, or a combination thereof) (e.g., on the surface), or a combination thereof, and thus such an emission layer may exhibit greatly increased hole transport capability.

The halogen may include chlorine. In the emission layer, a content of an organic material may be less than about 20 wt %, for example, less than or equal to about 19 wt %, less than or equal to about 18 wt %, less than or equal to about 17 wt %, less than or equal to about 16%, less than or equal to about 15 wt %, less than or equal to about 14 wt %, less than or equal to about 13 wt %, less than or equal to about 12 wt %, less than or equal to about 11 wt %, or less than or equal to about 10 wt %, based on a total weight of the emission layer (e.g., quantum dots). In the emission layer, a content of an organic material may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, or greater than or equal to about 7 wt %, based on a total weight of the emission layer. Such a content range may provide a device having more improved hole transport capability. A presence of the halogen may be confirmed by X-ray photoelectron spectroscopy (XPS), but is not limited thereto. The XPS of the emission layer may confirm the presence of a bond of $ZnCl_2$. A (molar or weight) ratio of halogen to Zn (e.g., confirmed by XPS or scanning electron microscopy with energy dispersive X-ray spectroscopy (SEM-EDX)) in the emission layer may be greater than or equal to about 0.0001:1, for example, greater than or equal to about 0.0005:1, greater than or equal to about 0.001:1, greater than or equal to about 0.002:1, greater than or equal to about 0.003:1, greater than or equal to about 0.004:1, greater than or equal to about 0.005:1, greater than or equal to about 0.006:1, greater than or equal to about 0.007:1, greater than or equal to about 0.008:1, greater than or equal to about 0.009:1, or greater than or equal to about 0.01:1. A ratio of halogen to Zn (e.g., confirmed by XPS or SEM-EDX) in the emission layer may be less than or equal to about 0.9:1, for example, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, less than or equal to about 0.1:1 less than or equal to about 0.09:1, less than or equal to about 0.08:1, less than or equal to about 0.07:1, less than or equal to about 0.06:1, less than or equal to about 0.05:1, less than or equal to about 0.04:1, or less than or equal to about 0.03:1. Such an emission layer may be obtained by forming an emission layer including quantum dots and treating the formed layer with a solution (e.g., alcohol solution) including a metal halide, which is described with regard to a method of manufacturing a light emitting device.

The light emitting element according to an embodiment includes a hole auxiliary layer 12 disposed between the emission layer and the anode, and an electron auxiliary layer 14 disposed between the emission layer and the cathode.

The hole auxiliary layer 12 may have one layer or two or more layers and may include, for example a hole injection layer, a hole transport layer, or a combination thereof. The hole auxiliary layer may include an electron blocking layer.

In an embodiment, the hole auxiliary layer of a hole minority device may include a first hole transport layer adjacent to the emission layer (hereinafter, also referred to as a hole delay layer). (refer to FIG. 2) A presence of the first hole transport layer may contribute to dominance of electrons relative to holes in the emission layer of the hole minority device during at least initial operating time.

The HOMO energy level difference between the first hole transport layer and the emission layer may be greater than about 0.05 eV, greater than about 0.1 eV, greater than about 0.15 eV, greater than about 0.2 eV, greater than about 0.25 eV, greater than about 0.3 eV, greater than or equal to about 0.35 eV, greater than or equal to about 0.4 eV, greater than or equal to about 0.45 eV, or greater than or equal to about 0.5 eV. The HOMO energy level difference between the first hole transport layer and the emission layer may be less than about 1 eV, for example, less than or equal to about 0.9 eV, less than or equal to about 0.85 eV, less than or equal to about 0.8 eV, less than or equal to about 0.75 eV, less than or equal to about 0.7 eV, less than or equal to about 0.65 eV, less than or equal to about 0.6 eV, less than or equal to about 0.55 eV, or less than or equal to about 0.5 eV. In a device of an embodiment, the quantum dot include an indium phosphide and the HOMO energy level difference between the first hole transport layer and the emission layer may be greater than or equal to about 0.1 eV and less than or equal to about 0.4 eV.

The first hole transport layer may have a hole mobility of less than about 0.01 cm$^2$/Vs, for example, less than or equal to about 0.005 cm$^2$/Vs, less than or equal to about 0.004 cm$^2$/Vs, less than or equal to about 0.003 cm$^2$/Vs, less than or equal to about 0.002 cm$^2$/Vs, less than or equal to about 0.001 cm$^2$/Vs, less than or equal to about 0.0009 cm$^2$/Vs, less than or equal to about 0.0008 cm$^2$/Vs, less than or equal to about 0.0007 cm$^2$/Vs, less than or equal to about 0.0006 cm$^2$/Vs, less than or equal to about 0.0005 cm$^2$/Vs, less than or equal to about 0.0004 cm$^2$/Vs, or less than or equal to about 0.0003 cm$^2$/Vs. The first hole transport layer may have a hole mobility of greater than or equal to about 0.0001 cm$^2$/Vs, greater than or equal to about 0.0002 cm$^2$/Vs, greater than or equal to about 0.0003 cm$^2$/Vs, greater than or equal to about 0.0004 cm$^2$/Vs, greater than or equal to about 0.001 cm$^2$/Vs, greater than or equal to about 0.005 cm$^2$/Vs, or greater than or equal to about 0.009 cm$^2$/Vs.

The first hole transport layer may include a polymer including a fluorene moiety. The polymer including the fluorene moiety may be a copolymer including a substituted or unsubstituted fluorene moiety as a repeating unit (e.g., in the main chain).

The polymer including the fluorene moiety may be a copolymer. The polymer including the fluorene moiety may have the fluorene moiety as a unit in a main chain of the polymer, or as a substituent of a unit of the polymer or copolymer. The copolymer may further include a divalent aromatic moiety (e.g., phenylene including a C6 to C40 alkyl or alkenyl group, an aromatic moiety in which a 5-membered aromatic ring and a 7-membered aromatic ring are fused) in addition to the fluorene moiety. The polymer including the fluorene moiety may include a *—RN(R$_1$)—* group (wherein, R is a direct bond, a C5 to C40 divalent substituted or unsubstituted aromatic hydrocarbon group (phenylene, naphthalene, and the like), a divalent C1 to C40 substituted or unsubstituted aliphatic hydrocarbon group (e.g., alkylene, alkenylene, alkynylene, etc.), or a combination thereof, R$_1$ is a monovalent organic group (e.g., an aliphatic hydrocarbon group such as an alkyl group, for example an alkyl group having 1 to 20 carbon atoms, an alkenyl group, for example an alkenyl group having 2 to 20 carbon atoms, an alkynyl group, for example an alkynyl group having to 20 carbon atoms, an aromatic hydrocarbon group such as alkylaryl group where the C6 to C20 aryl group is substituted with a C1 to C20 alkyl such as methyl phenyl, and the like), and * is a linking portion with adjacent atom) in the main chain. The fluorene moiety may be substituted with a monovalent C1 to C40 substituted or unsubstituted aliphatic hydrocarbon group (e.g., C1 to C20 alkyl, C2 to C20 alkenyl, C2 to C20 alkynyl, etc.), a monovalent C5 to C40 substituted or unsubstituted aromatic hydrocarbon group, or a combination thereof. The aromatic hydrocarbon group may include an aromatic ring and an alicyclic ring which are fused with each other. The polymer including the fluorene moiety may have repeating units having substituents different from the fluorene moiety. The polymer including the fluorene moiety may include a repeating unit including at least one, for example, at least two amino groups, at least one or at least two C1 to C40 aliphatic hydrocarbon groups, or a combination thereof. A polymerization degree of the polymer may be appropriately selected.

A thickness of the first hole transport layer is not particularly limited, and may be appropriately selected depending on the desired characteristics of the first hole transport layer. The general descriptions of the hole auxiliary layer may be also applied to the first hole transport layer (hole delay layer).

The HOMO energy level of the hole auxiliary layer 12 may be adjusted to match the HOMO energy level of the emission layer 13, which may contribute to strengthening hole mobility from the hole auxiliary layer 12 into the emission layer 13.

The HOMO energy level of the hole auxiliary layer (e.g., the hole transport layer) 12 adjacent to the emission layer may be the same as the HOMO energy level of the emission layer 13 or less than the HOMO energy level of the emission layer 13 within a range of less than or equal to about 1.0 eV. For example, a difference between the HOMO energy levels of the hole auxiliary layer 12 and the emission layer 13 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The HOMO energy level of the hole auxiliary layer 12 may be greater than or equal to about 5.0 eV, for example, greater than or equal to about 5.2 eV, greater than or equal to about 5.4 eV, greater than or equal to about 5.6 eV, or greater than or equal to about 5.8 eV. For example, the HOMO energy level of the hole auxiliary layer 12 may be about 5.0 eV to about 7.0 eV, about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

The LUMO energy level of the hole auxiliary layer 12 (or the first hole auxiliary layer) may be greater than or equal to about 1.5 eV, for example, greater than or equal to about 1.6 eV, greater than or equal to about 1.7 eV, greater than or equal to about 1.8 eV, greater than or equal to about 1.9 eV, greater than or equal to about 2.0 eV, greater than or equal to about 2.1 eV, greater than or equal to about 2.2 eV, greater than or equal to about 2.3 eV, greater than or equal to about 2.35 eV, and less than or equal to about 5 eV, for example less than or equal to about 4.5 eV, less than or equal to about 4 eV, less than or equal to about 3.9 eV, less than or equal to about 3.8 eV, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, less than or equal to about 3.1 eV, less than or equal to about 3.0 eV, less than or equal to about 2.9 eV, less than or equal to about 2.8 eV, less than or equal to about 2.7 eV, less than or equal to about 2.6 eV, less than or equal to about 2.5 eV, or less than or equal to about 2.4 eV.

In an embodiment, the hole auxiliary layer 12 may include a hole injection layer near, e.g., closer to, the anode 11; and a hole transport layer, a hole delay layer, or a combination thereof near, e.g., closer to, the emission layer 13. Herein, the HOMO energy level of the hole injection layer may be about 5.0 eV to about 6.0 eV, about 5.0 eV to about 5.5 eV, or about 5.0 eV to about 5.4 eV, and the HOMO energy level of the hole transport layer and the like may be about 5.2 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV. The HOMO energy level of the hole transport layer (e.g., hole delay layer) may be less than about 5.6 eV.

A material of the hole auxiliary layer 12 (e.g., hole transport layer, hole injection (delay) layer, or a combination thereof) is not particularly limited and may be for example poly(9,9-dioctyl-fluorene-co-N-(4-butylphenyl)-diphenylamine) (TFB), poly(9,9-dialkyl-fluorene-co-N-(4-alkylphenyl)-diphenylamine), polyarylamine, poly(N-vinylcarbazole), poly(3,4-ethylenedioxythiophene) (PEDOT), poly(3,4-ethylenedioxythiophene)polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), m-MTDATA (4,4',4''-Tris[phenyl(m-tolyl)amino]triphenylamine), 4,4',4''-tris(N-carbazolyl)-triphenylamine (TCTA), 1,1-bis(di-4-tolylamino)phenylcyclohexane (TAPC), a (e.g., cross-conjugated) fluorene polymer (e.g., a fluorene polymer or a copolymer having a C1 to C40 aliphatic hydrocarbon group (alkyl group, alkenyl group, alkynyl group, etc.) that is substituted or unsubstituted with a substituent, a $R_2N$ group (wherein R is hydrogen or a C1 to C10 alkyl group)), dipyrazino[2,3-f:2',3'-h]quinoxaline-2,3,6,7,10,11-hexacarbonitrile (HAT-CN), a p-type metal oxide (e.g., NiO, $WO_3$, $MoO_3$, etc.), a carbon-based material such as graphene oxide, or a combination thereof, but is not limited thereto.

In the hole auxiliary layer(s), a thickness of each layer may be appropriately selected depending on the desired characteristics of the hole auxiliary layer(s). For example, each layer may have a thickness of about 1 nm to about 40 nm. In an embodiment, the hole auxiliary (injection or transport) layer may have a thickness of greater than or equal to about 1 nm, for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 15 nm, or greater than or equal to about 20 nm, and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The electron auxiliary layer 14 is disposed between the emission layer 13 and the cathode 15. The electron auxiliary layer 14 may include for example an electron injection layer, an electron transport layer, a hole blocking layer, or a combination thereof, but is not limited thereto. In an embodiment, the electron auxiliary layer 14 may include an electron transport layer.

Figures 3, 4:
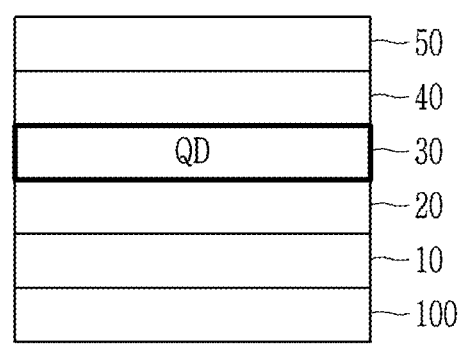
FIG. 3 is a schematic cross-sectional view of a QD LED device according to an embodiment.
FIG. 4 is a schematic cross-sectional view of a QD LED device according to an embodiment.

In an embodiment, the electron auxiliary layer of the electron minority device may include a first electron transport layer adjacent to the emission layer (hereinafter, also referred to as an electron delay layer). (refer to FIG. 3)

A presence of the first electron transport layer may contribute to dominance of electrons relative to holes in the emission layer of the electron minority device during at least initial operating time.

An electron mobility of the first electron transport layer may be less than or equal to about 0.01 $cm^2/Vs$, for example, less than or equal to about 0.009 $cm^2/Vs$, less than or equal to about 0.008 $cm^2/Vs$, less than or equal to about 0.007 $cm^2/Vs$, less than or equal to about 0.006 $cm^2/Vs$, less than or equal to about 0.005 $cm^2/Vs$, less than or equal to about 0.004 $cm^2/Vs$, less than or equal to about 0.003 $cm^2/Vs$, less than or equal to about 0.002 $cm^2/Vs$, or less than or equal to about 0.001 $cm^2/Vs$. The electron mobility of the first electron transport layer may be greater than or equal to about 0.0001 $cm^2/Vs$, for example, greater than or equal to about 0.0002 $cm^2/Vs$, greater than or equal to about 0.0003 $cm^2/Vs$, greater than or equal to about 0.0004 $cm^2/Vs$, or greater than or equal to about 0.0005 $cm^2/Vs$.

The first electron transport layer may include an organic material. The organic material may include a compound including at least one or at least two aromatic (or polyaromatic) rings (e.g., substituted or unsubstituted anthracene, substituted or unsubstituted naphthyl, or substituted or unsubstituted phenyl), a heteroaromatic ring compound (e.g., pyrazole or a compound including pyrazole, etc.), or a combination thereof. For example, the organic material may be a compound including at least two of an anthracene moiety, a naphthalene moiety, and/or a phenylene moiety. The organic material may include a pyrazole compound (e.g., pyrazole or a compound including pyrazole), or a combination thereof. The organic material may include a compound represented by the following chemical formula:

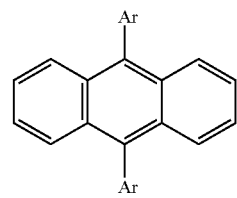

wherein, in the above chemical formula, each Ar may be the same or different, and may independently be a substituted or unsubstituted naphthyl, a substituted or unsubstituted phenyl, a substituted or unsubstituted naphthylphenyl, or a combination thereof.

The compound may include a compound of the following formula.

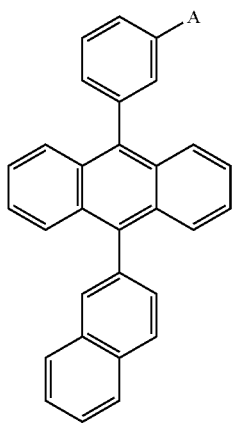

wherein, A is $R_2P(O)$— (wherein R is hydrogen or a C1 to C10 alkyl group), naphthyl, or a combination thereof.

In an embodiment, the first electron transport layer or the electron transport layer that will be described later may include nanoparticles including zinc metal oxide. The zinc metal oxide may include a compound represented by Chemical Formula 1:

$$Zn_{1-x}M_xO \qquad \text{Chemical Formula 1}$$

In Chemical Formula 1, M is Mg, Ca, Zr, W, Li, Ti, Y, Al, or a combination thereof, and $0 \leq x \leq 0.5$.

In an embodiment, in Chemical Formula 1, M may be magnesium (Mg). In an embodiment, in Chemical Formula 1, x may be greater than or equal to about 0.01 and less than or equal to about 0.3, for example, less than or equal to about 0.15.

The metal oxide may include zinc oxide, zinc magnesium oxide, or a combination thereof. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape or a nano wire shape.

A thickness of the first electron transport layer is not particularly limited, and may be appropriately selected depending on the desired characteristics of the first electron transport layer. The general descriptions of the electron auxiliary layer may be also applied to the first electron transport layer (electron delay layer).

The electron transport layer, the electron injection layer, or a combination thereof may include for example 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, HfO$_2$, etc.), or a combination thereof, but is not limited thereto.

The hole blocking layer may include for example 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq3, Inq3, Znq2, Zn(BTZ)$_2$, BeBq$_2$, or a combination thereof, but is not limited thereto.

In an embodiment, the thickness of the electron auxiliary layer 14 (e.g., the thickness of each of an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, or less than or equal to about 110 nm, and less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

In an embodiment, a HOMO energy level of the electron auxiliary layer 14 (e.g., an electron injection layer or an electron transport layer) may be greater than or equal to about 4.5 eV, greater than or equal to about 5 eV, greater than or equal to about 5.5 eV, greater than or equal to about 6 eV, greater than or equal to about 6.5 eV, greater than or equal to about 6.6 eV, greater than or equal to about 6.7 eV, greater than or equal to about 6.8 eV, greater than or equal to about 6.9 eV, greater than or equal to about 7 eV, greater than or equal to about 7.1 eV, greater than or equal to about 7.2 eV, greater than or equal to about 7.3 eV, greater than or equal to about 7.4 eV, greater than or equal to about 7.5 eV, greater than or equal to about 7.6 eV, greater than or equal to about 7.7 eV, greater than or equal to about 7.8 eV, greater than or equal to about 7.9 eV, or greater than or equal to about 8.0 eV and less than or equal to about 9.5 eV, less than or equal to about 9.0 eV, or less than or equal to about 8.5 eV. A LUMO energy level electron auxiliary layer 14 (e.g., an electron injection layer or an electron transport layer) may be greater than or equal to about 2.5 eV, greater than or equal to about 3.0 eV, greater than or equal to about 3.5 eV, or greater than or equal to about or 4.0 eV and less than or equal to about 7.0 eV, less than or equal to about 6.5 eV, less than or equal to about 6.0 eV, less than or equal to about 5.5 eV, less than or equal to about 5.0 eV, or less than or equal to about 4.5 eV.

A device according to an embodiment may have a normal structure. In an embodiment, in the device, an anode 10 disposed on a transparent substrate 100 may include a metal oxide-based transparent electrode (e.g., ITO electrode), and a cathode 50 facing the anode 10 may include a conductive metal (e.g., Mg, Al, Ag, or a combination thereof) (e.g., having a relatively low work function). A hole auxiliary layer 20 (e.g., a hole injection layer of PEDOT:PSS, a p-type metal oxide, or a combination thereof; a hole transport layer of TFB, PVK, or a combination thereof; or a combination thereof) may be disposed between the transparent electrode 10 and the quantum dot emission layer 30. The hole injection layer may be near, e.g., closer to, the transparent electrode and the hole transport layer may be near, e.g., closer to, the emission layer. An electron auxiliary layer 40 such as an electron injection layer/transport layer may be disposed between the quantum dot emission layer 30 and the cathode 50. (refer to FIG. 4)

Figure 5:
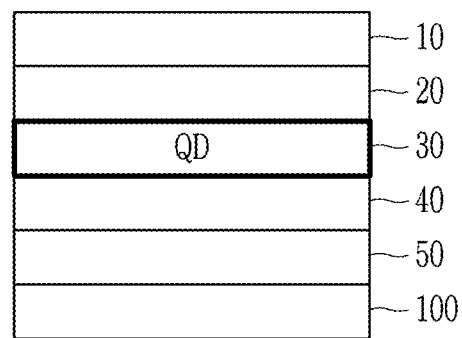
FIG. 5 is a schematic cross-sectional view of a QD LED device according to an embodiment.

A device according to an embodiment may have an inverted structure. A cathode 50 disposed on the transparent substrate 100 may include a metal oxide-based transparent electrode (e.g., ITO), and an anode 10 facing the cathode may include a metal (e.g., Au, Ag, Al, Mg, or a combination thereof) (e.g., having a relatively high work function). For example, (optionally doped) n-type metal oxide (crystalline Zn metal oxide) may be disposed between the transparent electrode 50 and the emission layer 30 as an electron auxiliary layer (e.g., electron transport layer) 40. $MoO_3$ or other p-type metal oxides may be disposed between the metal anode 10 and the quantum dot emission layer 30 as a hole auxiliary layer (e.g., a hole transport layer including TFB, PVK, or a combination thereof, a hole injection layer including $MoO_3$ or other p-type metal oxides) 20. (refer to FIG. 5)

The device may have the aforementioned configurations (i.e., imbalance between electrons and holes in the emission layer), and thus may exhibit a maximum, e.g., local maximum, in the life-span (time-luminance (%)) curve in a range of for example from 0 hour (or from about 0.5 hours) to about 2 hours (or to about 1.5 hours, or to 1 hour). In the life span curve, a tangent line slope may change from positive to negative (or may be zero) prior to and after (or at) the local maximum point. In an embodiment, the local maximum may be at least 1.05 times as large as the initial luminance of the device. The local maximum may be at least 1.06 times, at least 1.07 times, at least 1.08 times, at least 1.09 times, or at least 1.1 times as large as the initial luminance of the device. The local maximum may be at least 1.2 times, at least 1.3 times, or at least 1.4 times as large as the initial luminance of the device. Without being bound by any particular theory, the device according to an embodiment has charge imbalance in the emission layer, and thus the luminescence region may be formed closer to the interface between the emission layer and the electron auxiliary layer or the interface between the emission layer and the hole auxiliary layer, and the injection rate of minor charge into the emission layer may be limited as needed. For example, in the hole minority device, the luminescence region may be formed at the HTL/QD interface and the hole mobility of the HTL or the hole delay layer may be lowered. In the electron minority device, the luminescence region may be formed at the ETL/QD interface and the electron mobility of the ETL or the electron delay layer may be lowered, or hole transport capability in the emission layer may be greatly increased. The device having the above configuration according to an embodiment may exhibit overshoot phenomenon, which may have a favorable effect on a life-span of the device.

In case of the light emitting device according to an embodiment, when the device is deteriorated to show a luminance of 40% of its initial luminance, a ratio of a photoluminescence intensity at a maximum peak wavelength of the light emitting device may be less than or equal to about 0.5, for example less than or equal to about 0.4, relative to an initial value thereof. Stated otherwise, a photoluminescence intensity at a maximum peak wavelength of the electroluminescent device when it is deteriorated to show a luminance of about 40% of its initial luminance is less than or equal to about 0.5 times, for example less than or equal to 0.4 times of the initial photoluminescence intensity of the device. The fact that the relative photoluminescence intensity value (with respect to the initial value) of the electroluminescent device after its deterioration is reduced may indicate that in the device of the embodiment, the quantum dots may make the sufficient use of its luminescence performance. Therefore, the aforementioned features of the electroluminescent device of the embodiment may be combined with each other to provide an environment in which the quantum dots included therein may sufficiently exhibit desirable luminescence performance. These configurations of the electroluminescent device may contribute to allowing the device to exhibit an improved life-span.

In an embodiment, a display device including the aforementioned light emitting device is provided.

An embodiment provides a method of manufacturing the aforementioned light emitting device. The manufacturing method includes forming a hole auxiliary layer on an anode; forming an emission layer on the hole auxiliary layer; forming a charge auxiliary layer on the emission layer; and forming a cathode on the charge auxiliary layer.

Details of the anode, the hole auxiliary layer, the emission layer, the electron auxiliary layer, and the cathode are the same as described above. Methods of forming these are not particularly limited and may be appropriately selected taking into consideration materials and properties.

In an embodiment, the forming of the emission layer includes forming a quantum dot layer including a plurality of quantum dots with an organic ligand on a surface thereof; and treating the quantum dot layer with a metal halide to remove at least a portion of the organic ligand. The treated emission layer may exhibit greatly increased hole transport capability, and may cause charge imbalance in the emission layer in accordance with selection of the electron protective layer.

The forming of the quantum dot layer may be performed by dispersing the quantum dots in a solvent (e.g., an organic solvent) to obtain a quantum dot dispersion and applying or depositing the quantum dot dispersion on the substrate or on the charge auxiliary layer in an appropriate manner (e.g., spin coating, inkjet printing, etc.). The forming of the emission layer may further include heat-treating the formed quantum dot layer. A temperature of the heat-treating is not particularly limited, and may be selected appropriately taking into consideration a boiling point of the organic solvent. For example, the heat-treating temperature may be greater than or equal to about 60° C. The organic solvent of the quantum dot dispersion is not particularly limited and thus may be appropriately selected. In an embodiment, the organic solvent may include a (substituted or unsubstituted) aliphatic hydrocarbon organic solvent, a (substituted or unsubstituted) aromatic hydrocarbon organic solvent, an acetate solvent, or a combination thereof.

The treating of the formed quantum dot layer may include preparing an alcohol solution of a metal halide; contacting the alcohol solution with the quantum dot layer; and removing the alcohol solution from the quantum dot layer and drying the quantum dot layer.

The metal halide may include Group 2 metal (e.g., zinc). The metal halide may include a fluoride, a chloride, a bromide, an iodide, or a combination thereof. In an embodiment, the metal halide may include a zinc chloride.

The preparing of the alcohol solution of the metal halide may include dissolving the aforementioned metal halide in an alcohol solvent (e.g., a C1 to C10 alcohol, for example, methanol, ethanol, propanol, isopropanol, butanol, pentanol, hexanol, heptanol, etc.). A metal halide concentration in the alcohol solution may be greater than or equal to about 0.001 grams per liter (g/L), for example, greater than or equal to about 0.01 g/L, greater than or equal to about 0.1 g/L, greater than or equal to about 1 g/L, greater than or equal to about 10 g/L, greater than or equal to about 50 g/L, greater than or equal to about 60 g/L, greater than or equal to about 70 g/L, greater than or equal to about 80 g/L, or greater than or equal to about 90 g/L and less than or equal to about 1000 g/L, for example, less than or equal to about 500 g/L, less than or equal to about 400 g/L, less than or equal to about 300 g/L, less than or equal to about 200 g/L, less than or equal to about 100 g/L, less than or equal to about 90 g/L, less than or equal to about 80 g/L, less than or equal to about 70 g/L, less than or equal to about 60 g/L, less than or equal to about 50 g/L, less than or equal to about 40 g/L, less than or equal to about 30 g/L, less than or equal to about 20 g/L, or less than or equal to about 10 g/L, but is not limited thereto.

Contacting the alcohol solution with the quantum dot layer may include adding the alcohol solution to the quantum dot layer in a dropwise fashion and optionally spin coating the alcohol solution after adding the alcohol solution in a dropwise fashion. The adding in a dropwise fashion (and optional spin coating) may be performed at least once, for example, at least twice, at least three times, or at least four times.

The removing of the alcohol solution from the quantum dot layer may include washing (e.g., adding the alcohol solvent in a dropwise fashion and optionally spin coating) the quantum dot layer contacting the alcohol solution, with an alcohol solvent. The washing may be performed at least once, for example, at least twice, or at least three times.

The drying of the quantum dot layer from which the alcohol solution is removed may include heating the quantum dot layer at a predetermined temperature.

The heating temperature may be greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. The heating temperature may be less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., less than or equal to about 110° C., less than or equal to about 100° C., or less than or equal to about 90° C.

An embodiment provides an electronic device including the aforementioned light emitting device. The electronic device may be applied to various electronic devices such as display devices or lighting devices. In an embodiment, the display device includes the aforementioned light emitting device.

Hereinafter, the embodiments are illustrated in more detail with reference to examples. However, these examples are exemplary, and the present scope is not limited thereto.

Analysis Methods

1. Photoluminescence Analysis

Photoluminescence (PL) spectra of the prepared nanocrystal are obtained using a Hitachi F-7000 spectrometer at an irradiation wavelength of 420 to 430 nanometers (nm).

2. Ultraviolet-Visible (UV-Vis) Spectroscopy

Hitachi U-3310 spectrometer is used to perform a UV spectroscopy and obtain UV-Visible absorption spectra.

3. Transmission Electron Microscopy (TEM) Analysis

Transmission electron microscopic analyses of particles are obtained using an UT F30 Tecnai electron microscope.

4. X-Ray Diffraction Analysis (XRD)

An XRD analysis is performed using a Philips XPert PRO equipment with a power of 3 kilowatts (kW).

5. Electroluminescence Spectroscopy

A current depending on a voltage is measured using a Keithley 2635B source meter while applying a voltage and electroluminescence (EL) light emitting luminance is measured using a CS2000 spectroscopy.

6. Evaluation of Hole or Electron Transport Capability (1) A hole only device (HOD) having a structure of an electrode/a lower hole injection and transport layer/a quantum dot (QD) emission layer/an upper hole transport, injection layer, or a combination thereof/an electrode (e.g., having a structure of indium tin oxide (ITO)/poly(3,4-ethylenedioxythiophene)polystyrene sulfonate (PEDOT:PSS)/poly(9,9-dioctyl-fluorene-co-N-(4-butylphenyl)-diphenylamine) (TFB)/QD emission layer/organic hole transport layer (HTL) 360 Å/dipyrazino[2,3-f:2',3'-h]quinoxaline-2,3,6,7,10,11-hexacarbonitrile (HAT-CN) 100 Å/Ag) is for example manufactured in the following method: an ITO patterned substrate is ultraviolet (UV)-ozone (UVO)-surface treated. The hole injection layer (e.g., PEDOT:PSS layer) is spin-coated to have a thickness of about 30 nm and then, heat-treated to remove a residual organic material. The hole transport layer (e.g., a TFB layer or a given hole transport material layer) is spin-coated to have a thickness of about 25 nm and then, heat-treated to remove a residual organic material. A quantum dot dispersion is spin-coated to form a 15 to 40 nm-thick emission layer and then, heat-treated to remove a residual organic material. The upper hole transport layer is formed by sequentially thermally depositing an organic HTL/HAT-CN (dipyrazino[2,3-f:2',3'-h]quinoxaline-2,3,6,7,10,11-hexacarbonitrile) layer to be 35 to 40 nm thick/10 to 15 nm thick. Then, silver (Ag) is thermally deposited under a mask to form an electrode. A sealing resin/glass is used to seal the device.

Hole transport capability of the manufactured HOD is evaluated by measuring a current depending on a voltage by using a Keithley 2635B source meter, while the voltage is applied thereto.

(2) An electron only device (EOD) having a laminate structure of an electrode/a lower electron injection and electron transport layer/a QD emission layer/an upper electron transport layer/an electron injection layer/an electrode (e.g., ITO/ZnMgO 300 Å/QD emission layer/ZnMgO 300 Å/Al 1000 Å) is manufactured in the following method. An ITO patterned substrate is ultraviolet (UV)-ozone (UVO)-surface treated. The lower electron injection/transport layer (e.g., ZnMgO layer) is spin-coated to have a thickness of about 20 to 40 nm and then, heat-treated to remove a residual organic material. Quantum dot dispersion is spin-coated to form a 15 to 40 nm-thick emission layer and then, heat-treated to remove a residual organic material. The ZnMgO layer as an upper electron transport layer is spin-coated to have a thickness of about 20 to 40 nm and then, heat-treated to remove a residual organic material. Then, aluminum (Al) is thermally deposited under a mask under a vacuum atmosphere to form an electrode. A sealing resin/glass is used to seal the device.

Electron transport capability of the manufactured EOD is evaluated by measuring a current depending on a voltage by using a Keithley 2635B source meter, while the voltage is applied thereto.

7. Measurement of HOMO Energy Level:

HOMO energy levels are measured by an AC3 method using a photoelectron spectrophotometer (model name: AC-3, manufactured by Riken Keiki Co., Ltd.) (for example, under an atmospheric condition).

8. Measurement of Charge Mobility:

Charge (electron or hole) mobility is measured using time of flight (TOF) or impedance spectroscopy.

Synthesis of Quantum Dot

Reference Example 1-1

(1) Selenium (Se) and tellurium (Te) are dispersed in trioctylphosphine (TOP) to obtain a Se/TOP stock solution and Te/TOP stock solution. 0.125 millimoles (mmol) of zinc acetate is added along with oleic acid to a reactor including trioctylamine and treated under vacuum at 120° C. After 1 hour, an atmosphere in the reactor is converted to nitrogen.

Subsequently, the reactor is heated up to 300° C., the prepared Se/TOP stock solution and Te/TOP stock solution are rapidly injected thereinto in a Te/Se ratio of 1/25. When the reaction is complete, acetone is added to the reaction solution that is rapidly cooled down into room temperature, and a precipitate obtained by centrifugation is dispersed in toluene to obtain a ZnTeSe quantum dot.

(2) 1.8 mmoL (0.336 grams (g)) of zinc acetate is added along with oleic acid to a flask including trioctylamine and treated under vacuum at 120° C. for 10 minutes. The atmosphere in the flask is substituted with nitrogen ($N_2$) and a temperature is increased to 180° C. The ZnTeSe core obtained in Synthesis Example 1 is added and Se/TOP and STOP are injected. The reaction temperature is set to be about 280° C. After the reaction is complete, the reactor is cooled and the prepared nanocrystal is centrifuged with ethanol and is dispersed in toluene to obtain a ZnTeSe/ZnSeS core/shell quantum dot (photoluminescence peak wavelength: 455 to 465 nm).

Reference Example 1-2

Preparation of Red Light Emitting InP Quantum Dot (1) 0.2 mmol of indium acetate is dissolved along with palmitic acid in a 300 milliliter (mL) reaction flask including 1-octadecene and heated at 120° C. under vacuum. After 1 hour, atmosphere in the reactor is converted to nitrogen. After heating at 280° C., a mixed solution of tris(trimethylsilyl)phosphine (TMS3P) trioctylphosphine are rapidly injected and reacted for 30 minutes. Acetone is added to the reaction solution which has been rapidly cooled at room temperature and centrifuged to provide a precipitate, and the obtained precipitate is dispersed in toluene.

Se powder and S powder are dissolved in TOP to prepare a Se/TOP stock solution and an S/TOP stock solution.

Zinc acetate and oleic acid are dissolved in trioctylamine in a 300 mL reaction flask and treated under vacuum at 120° C. for 10 minutes. The atmosphere in in the flask is substituted with Nitrogen ($N_2$) and then heated at 180° C.

The obtained InP core is added and a predetermined amount of the Se/TOP stock solution and a predetermined amount of the STOP were added, and a reaction is performed at reaction temperature of 280° C. for 60 minutes while.

An excessive amount of ethanol is added into the reactant including the semiconductor nanocrystal and centrifuged. After the centrifugation, a supernatant is discarded, the precipitate is dried and then dispersed in chloroform or toluene to provide a quantum dot solution (hereinafter, QD solution). The obtained quantum dots emit red light (photoluminescence peak wavelength: 620-640 nm). A HOMO energy level of the produced quantum dot is 5.55 electronvolts (eV).

Reference Example 1-3

CdO (0.4 mmol), octadecyl phosphonic acid (0.8 mmol), and trioctylamine (16 g) are put in a reactor and heated at 150° C. under vacuum while stirred. The atmosphere in the reaction flask is substituted with $N_2$ and the temperature is increased to 300° C. Se powder (Alfa, 200 mesh 99.999%) and trioctylphosphine (Aldrich, 90%) as a 2.0 M solution are reacted to produce a Se precursor, 1 mL of the precursor is rapidly injected into a Cd mixed solution at 300° C., and after 2 minutes, the mixture is cooled down to 50 to 60° C. The reaction solution cooled down to room temperature is added to ethanol and centrifuged to obtain a precipitate (CdSe) and the precipitate is dispersed in toluene.

0.05 mmol of cadmium acetate, 0.4 mmol of zinc acetate, 1.5 mL of oleic acid, and 20 mL of trioctyl amine are put in a reaction flask and treated under vacuum at 120° C. The atmosphere in the reaction flask is substituted with $N_2$ and the temperature is increased to 320° C. 0.6 mL of the CdSe core solution is injected and 2 mL of S/TOP rapidly injected, and then reacted for 30 minutes. After completing the reaction, the reaction solution is rapidly cooled down into room temperature, is added to ethanol and centrifuged to obtain a precipitate, and the precipitate is dispersed in chloroform to obtain a cadmium quantum dot solution. A HOMO energy level of the produced quantum dot is 5.9 eV.

Synthesis of Metal Oxide Nanoparticles

Reference Example 2

Synthesis of Zn Metal Oxide Nanoparticles

Zinc acetate dihydrate and magnesium acetate tetrahydrate are added to dimethyl sulfoxide in a reactor so that a mole ratio of the following chemical formula is provided, and the reactor is heated at 60° C. in the air. Subsequently, an ethanol solution of tetramethyl ammonium hydroxide pentahydrate is added in a dropwise fashion thereto at a rate of 3 milliliters per minute (mL/min). The obtained mixture is stirred for one hour, and $Zn_xMg_{1-x}O$ nanoparticles produced therein are centrifuged and dispersed in ethanol to obtain $Zn_xMg_{1-x}O$ nanoparticles. (x=greater than or equal to 0.5 and less than or equal to 1)

The obtained nanoparticles are performed with an X-ray diffraction analysis to confirm that ZnO crystals are formed. A transmission electron microscopic analysis is performed for the obtained nanoparticles, and the results show that the particles have an average size of about 3 nm.

Energy bandgap of the obtained nanoparticles is measured and monitored by a UV band edge tangent line (UV-2600, SHIMADZU). The results show that the synthesized ZnO has an energy bandgap of about 3.52 eV to 3.70 eV.

Manufacture of Light Emitting Device

Example 1

Hole Minority Device

A device having a laminate structure of ITO/PEDOT:PSS (30 nm)/poly(9,9-dioctyl-fluorene-co-N-(4-methylphenyl)-diphenylamine) (YGHT003) (25 nm)/CdSe QD (20 nm)/organic electron transport layer (OETL) (36 nm)/Al (100 nm) is manufactured as follows.

A surface of an ITO-deposited glass substrate is treated with UV-ozone for 15 minutes and then spin-coated with a PEDOT:PSS solution (H. C. Starks), heated at 150° C. for 10 minutes under air atmosphere, and then heat-treated again at 150° C. for 10 minutes under $N_2$ atmosphere to provide a hole injection layer having a thickness of 30 nm. Subsequently, poly(9,9-dioctyl-fluorene-co-N-(4-methylphenyl)-diphenylamine) (hereinafter, abbreviated as a YGHT003) including a fluorene copolymer (hexylphenylene repeating unit, 5-membered and 7-membered aromatic ring junction unit, aromatic moiety (aryl)-substituted fluorene repeating unit, and alkenyl group-substituted fluorene repeating unit)

is spin-coated on the hole injection layer, heat-treated at 150° C. for 30 minutes to form a first hole transport layer. A HOMO energy level and hole mobility of YGHT003 are measured and summarized in Table 1.

CdSe-based core-shell quantum dot produced in Reference Example 1-3 is spin-coated on the obtained first hole transport layer and heat-treated at 80° C. for 30 minutes to form an emission layer.

Organic electron transport layer (ETL) materials (manufacturer: Novaled) including NET & NDN series including a mixture of an anthracene-based compound and a pyrazole compound are thermally deposited under a vacuum state on the emission layer, and sequentially aluminum (Al) is deposited under vacuum to form a cathode, manufacturing a light emitting device.

Hole transport capability (HT) of the manufactured device (with HOD manufactured using YGHT003 as the lower hole transport layer and using the same materials as the above-mentioned materials for other common layers) is measured and electron transport capability (ET) (with EOD manufactured using the above-mentioned materials of the common layers and ZnMgO) is measured, and the results are summarized in Table 2.

Figure 6:
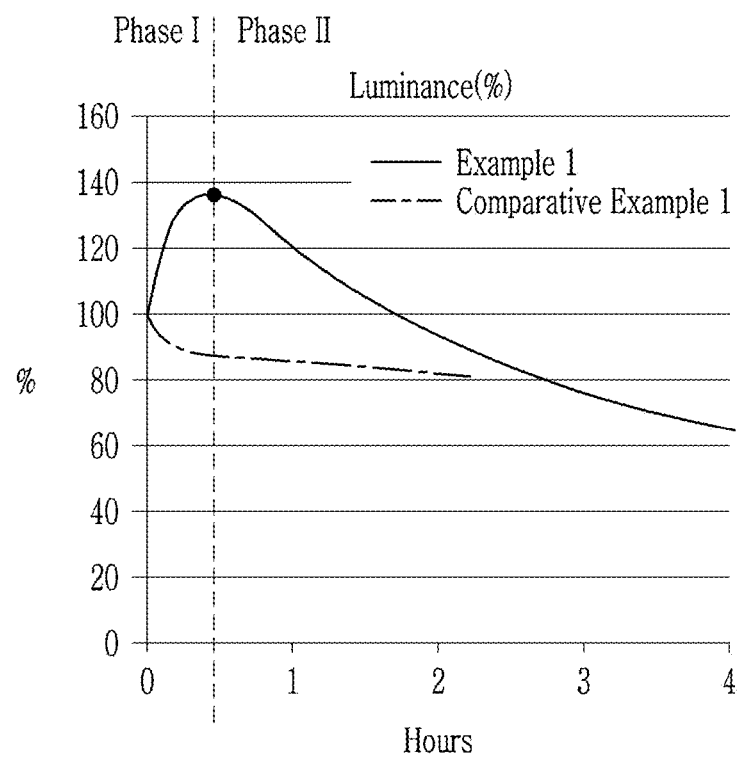
FIG. 6 is a graph of luminance (%) versus hours showing a life-span-luminance curve of the devices of Example 1 and Comparative Example 1.

The manufactured light emitting device is evaluated for the life-span characteristic of the device at 100 nits (candelas per square meter) using a Keithley 2200 source measuring instrument and a Minolta CS2000 spectroradiometer (current-voltage-luminance measuring instrument), and the results are shown in FIG. 6. According to the measurement results, the manufactured light emitting device has a luminance overshoot over time, and it is predicted that T95 of the device (i.e., the time to reach a relative luminance of 95% with respect to the initial luminance) exceeds about 20 hours.

Comparative Example 1

A device having a laminate structure of ITO/PEDOT:PSS (30 nm)/TFB (25 nm)/CdSe QD (20 nm)/OETL (36 nm)/Al (100 nm) is manufactured according to the same method as Example 1, except that a TFB-based first hole transport layer is formed instead of the first hole transport layer YGHT003 as follows:

A poly[(9,9-dioctylfluorenyl-2,7-diyl-co(4,4'-(N-4-butylphenyl)diphenylamine]solution (TFB) (Sumitomo) is spin-coated on hole the injection layer and at heat-treated at 150° C. for 30 minutes to form a first hole transport layer. A HOMO energy level and hole mobility of TFB are measured and summarized in Table 1.

For the manufactured device (with HOD manufactured using TFB as the lower hole transport layer and using the same materials as the above-mentioned materials for other common layers), HT is measured and (with EOD manufactured using the above-mentioned materials of the common layers and ZnMgO) ET is measured, and the results are summarized in Table 2.

The manufactured light emitting device is evaluated for the life-span characteristic of the device at 100 nits using a Keithley 2200 source measuring instrument and a Minolta CS2000 spectroradiometer (current-voltage-luminance measuring instrument), and the results are shown in FIG. 6.

According to the measurement results, the manufactured light emitting device does not have a luminance overshoot over time, and it is predicted that T95 of the device (i.e., the time to reach a relative luminance of 95% with respect to the initial luminance) is about 2.4 hours.

TABLE 1

|  | TFB | YGHT003 |
|---|---|---|
| HOMO (eV) | 5.6 | 5.4 |
| Hole mobility ($\mu_h$) (square centimeters per volt second ($cm^2/Vs$)) | $10^{-2}$ | $2*10^{-4}$ |

TABLE 2

|  | Example 1 (YGHT003) | Comparative Example 1 (TFB) |
|---|---|---|
| HT (milliamperes per square centimeter ($mA/cm^2$), at 8 volts (V)) | 0.01 | 0.1 |
| ET ($mA/cm^2$, at 8 V) | 5 | 5 |
| Log (HT/ET) | −2.7 | −1.7 |

Example 2

Electron Minority Device

A light emitting device having a structure of ITO/PEDOT:PSS (30 nm)/TFB (25 nm)/Blue oleic acid (OA) spin-dry QD (20 nm)/ZnMgO (20 nm)/Al (100 nm).

A surface of an ITO-deposited glass substrate is treated with UV-ozone for 15 minutes and then spin-coated with a PEDOT:PSS solution (H. C. Starks), heated at 150° C. for 10 minutes under air atmosphere, and then heat-treated again at 150° C. for 10 minutes under $N_2$ atmosphere to provide a hole injection layer having a thickness of 30 nm. Subsequently, a poly[(9,9-dioctylfluorenyl-2,7-diyl-co(4,4'-(N-4-butylphenyl)diphenylamine]solution (TFB) (Sumitomo) is spin-coated on the hole injection layer and then heat-treated at 150° C. for 30 minutes to form a hole transport layer.

The ZnTeSe core-shell quantum dot produced in Reference Example 1-1 is spin-coated on the hole transport layer and heat-treated at 80° C. for 30 minutes to form a quantum dot layer. Zinc chloride is dissolved in a 1:1 mixture of ethanol and methanol to prepare a treating solution (concentration: 0.1 grams per milliliter (g/mL)). The treating solution is added in a dropwise fashion on the formed quantum dot layer, allowed to stand, removed, and several times washed with ethanol. The washed quantum dot layer is dried on an 80° C. hot plate to obtain a first emission layer which is subjected to a ligand removal treatment (hereinafter, spin-dry treatment).

It is confirmed by infrared spectroscopy that by the spin-dry treatment, the (native) organic ligand (for example, oleic acid) existing in the quantum dots from the synthesis is reduced by about 30% of the initial amount. It is confirmed that the content of the organic ligand on the quantum dot in the obtained quantum dot is approximately 7 to 10%, based on the total weight of the emission layer (for example, based on a total weight of the quantum dots of the emission layer).

A solution (solvent: ethanol) of the ZnMgO nanoparticles obtained in Reference Example 2 is prepared. The prepared solution is spin-coated on the emission layer and heat-treated at 80° C. for 30 minutes to form an electron auxiliary layer. Aluminum (Al) is deposited under vacuum on a portion of the surface of the obtained electron auxiliary layer to form a cathode, manufacturing a light emitting device.

HT and ET of the manufactured device are measured and summarized in Table 3.

The manufactured light emitting device is evaluated for the electroluminescence property and life-span characteristic of the device at 100 nits using a Keithley 2200 source measuring instrument and a Minolta CS2000 spectroradiometer (current-voltage-luminance measuring instrument). The results are summarized in Table 4 and FIG. 7A.

Comparative Example 2

A light emitting device having a structure of ITO/PEDOT:PSS (30 nm)/TFB (25 nm)/Blue OA QD (20 nm)/ZnMgO (20 nm)/Al (100 nm) is manufactured according to the same method as Example 2, except that quantum dot emission layer is not subjected to spin-dry treatment.

HT and ET of the manufactured device are measured and summarized in Table 3.

The manufactured light emitting device is evaluated for the electroluminescence property and life-span characteristic of the device at 100 nits using a Keithley 2200 source measuring instrument and a Minolta CS2000 spectroradiometer (current-voltage-luminance measuring instrument). The results are summarized in Table 4 and FIG. 7B.

TABLE 3

|  | Example 2 (B spin-dry) | Comparative Example 2 (Blue OA) |
|---|---|---|
| HT (mA/cm$^2$, at 8 V) | 164 | 0.07 |
| ET (mA/cm$^2$, at 8 V) | 0.2 | 6.3 |
| Log (HT/ET) | 2.9 | −1.95 |

TABLE 4

| Description | Max. EQE | EQE @ 100 nits | Max. Cd/A | Cd/m$^2$ @ 5 mA | Lambda max. | Max. Lum. | T95 |
|---|---|---|---|---|---|---|---|
| Example 2 (B spin dry) | 2.7 | 2.6 | 2.4 | 122 | 461 | 4940 | 2.8 |
| Comparative Example 2 (Blue OA) | 3.2 | 2.2 | 1.6 | 44 | 454 | 3740 | 1.6 |

Max. EQE: maximum external quantum efficiency
EQE @ 100 nits: external quantum efficiency at luminance of 100 nits
Max. Cd/A (candelas per ampere): maximum current efficiency
Lambda max.: maximum photoluminescence wavelength
Max. Lum.: maximum luminance (cd/m$^2$)

Figure 7A:
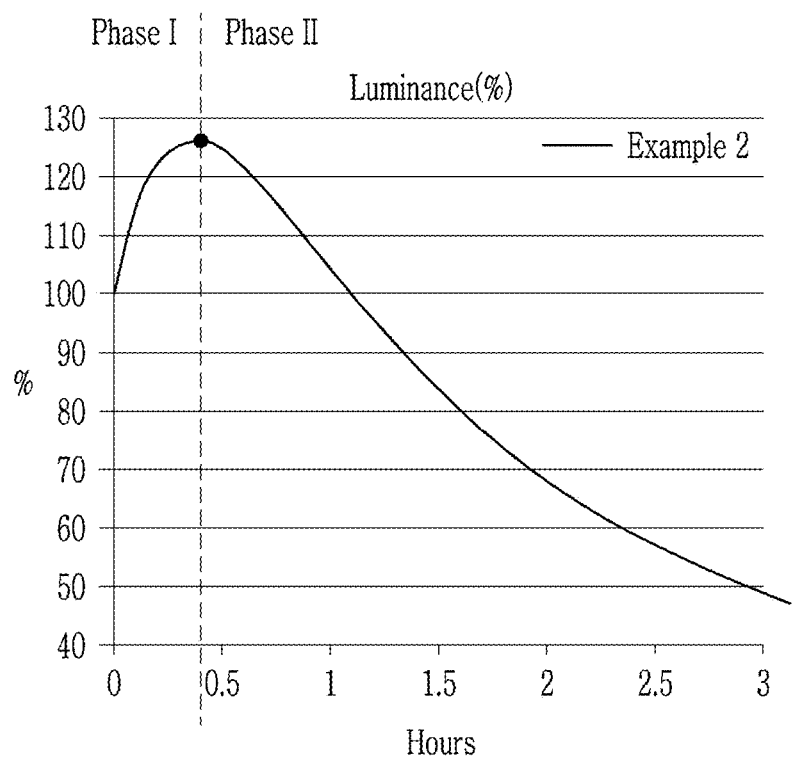
FIGS. 7A and 7B are graphs of luminance (%) versus hours showing life-span-luminance curves of the devices of Example 2 and Comparative Example 2, respectively.
Figure 7B:
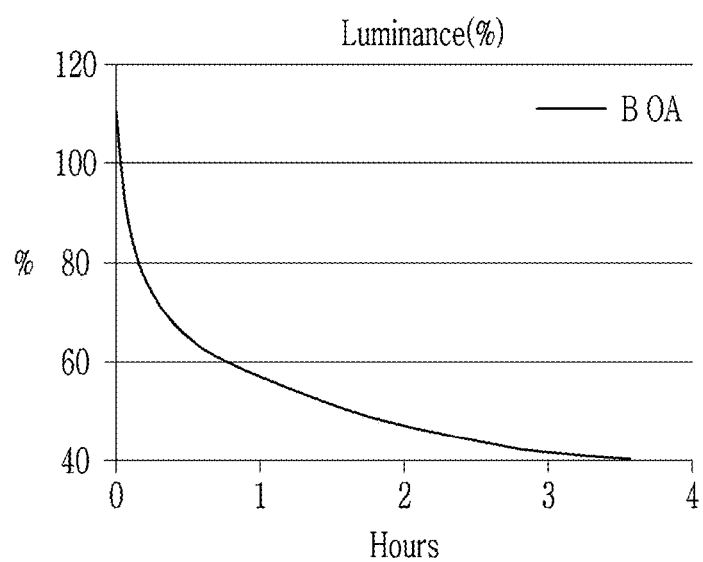

From the results of Table 3 and FIGS. 7A and 7B, it is confirmed that the devices of the Examples have charge imbalance and have overshoot of luminance over time. The devices of the Examples have improved electroluminescence properties and extended life-span.

Example 3

Non-Cadmium Hole Minority Device

A device having a laminate structure of ITO/PEDOT:PSS (30 nm)/YGHT003 (25 nm)/InP QD (20 nm)/8-(4-(4,6-di(naphthalen-2-yl)-1,3,5-triazin-2-yl)phenyl)quinolone):8-hydroxyquinolinato lithium (ET204:Liq) (36 nm)/Liq 0.5 nm/Al (100 nm) is manufactured according to the same method as Example 1, except that the InP-based quantum dot produced in Reference Example 1-2 is used in the emission layer and ET204:Liq 36 nm/Liq 0.5 nm organic electron auxiliary layer (OETL) is formed on the emission layer by a thermal deposition under vacuum.

HT and ET of the manufactured device are measured in the same method as Example 1 and summarized in Table 5.

The manufactured light emitting device is evaluated for the life-span characteristic of the device at 300 nits using a Keithley 2200 source measuring instrument and a Minolta CS2000 spectroradiometer (current-voltage-luminance measuring instrument). According to the measurement results, the manufactured light emitting device has a luminance overshoot over time, and it is confirmed that T50 of the device (i.e., the time to reach a relative luminance of 50% with respect to the initial luminance) is about 1.2 hours.

Comparative Example 3

A device having a laminate structure of ITO/PEDOT:PSS (30 nm)/TFB (25 nm)/InP QD (20 nm)/ET204:Liq (36 nm)/Liq (0.5 nm)/Al (100 nm) is manufactured according to the same method as Example 1, except that a TFB-based first hole transport layer is formed instead of the first hole transport layer YGHT003 as follows, the InP-based quantum dot produced in Reference Example 1-1 is used in the emission layer, and ET204:Liq (36 nm)/Liq (0.5 nm) organic electron auxiliary layer (OETL) is formed on emission layer by a thermal deposition under vacuum.

A poly[(9,9-dioctylfluorenyl-2,7-diyl-co(4,4'-(N-4-butylphenyl)diphenylamine]solution (TFB) (Sumitomo) is spin-coated on the hole injection layer and heat-treated at 150° C. for 30 minutes to form a first hole transport layer.

HT and ET of the manufactured device are measured in the same method as Example 1 and summarized in Table 5.

The manufactured light emitting device is evaluated for the life-span characteristic of the device at 300 nits using a Keithley 2200 source measuring instrument and a Minolta CS2000 spectroradiometer (current-voltage-luminance measuring instrument). According to the measurement results, the manufactured light emitting device has a luminance overshoot over time, and it is confirmed that T50 of the device (i.e., the time to reach a relative luminance of 50% with respect to the initial luminance) is about 0.6 hours.

TABLE 5

|  | Example 3 | Comparative Example 3 |
|---|---|---|
| HT (mA/cm$^2$, at 8 V) | 0.01 | 0.1 |
| ET (mA/cm$^2$, at 8 V) | 5 | 5 |
| Log (HT/ET) | −2.7 | −1.7 |

Experimental Example 1

Comparison of Photoluminescence Properties Before and After EL Degradation

The devices of Example 3 and Comparative Example 3 are driven by injecting a constant current corresponding to 300 nits luminance to degrade the electroluminescence properties of the devices to 40% of the initial value thereof. The intensity (photoluminescence intensity) of the light emitted by irradiating the light in a wavelength of 372 nm before and after the degradation is measured, and the results are summarized in Table 6.

TABLE 6

| | PL intensity ratio |
|---|---|
| Example 3 | 0.37 |
| Comparative Example 3 | 0.58 |

From the results of Table 6, it is confirmed that the device showing a greater decrease in the QD PL property after EL degradation of the device may exhibit a longer life-span.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: light emitting device
11: anode
12, 20: hole auxiliary layer
13, 30: emission layer
14, 40: electron auxiliary layer
15, 50: cathode
100 substrate
10 anode

What is claimed is:

1. An electroluminescent device, comprising:
an anode and a cathode spaced from one another,
an emission layer disposed between the anode and the cathode, the emission layer comprising quantum dots,
a hole auxiliary layer disposed between the emission layer and the anode, and
an electron auxiliary layer disposed between the emission layer and the cathode,
wherein the electroluminescent device is configured to have an imbalance between electrons and holes in the emission layer at an operation of the device, whereby the electrons are dominant in the emission layer and a logarithmic value of a hole transport capability measured in milliamperes per square centimeter relative to an electron transport capability measured in milliamperes per square centimeter is less than or equal to about −1, or
whereby the holes are dominant in the emission layer and the logarithmic value of the hole transport capability measured in milliamperes per square centimeter relative to the electron transport capability measured in milliamperes per square centimeter is greater than or equal to about 0.5.

2. The electroluminescent device of claim 1, wherein the logarithmic value of the hole transport capability measured in milliamperes per square centimeter relative to the electron transport capability measured in milliamperes per square centimeter is less than or equal to about −2 when the electrons are dominant in the emission layer.

3. The electroluminescent device of claim 1, wherein the logarithmic value of the hole transport capability measured in milliamperes per square centimeter relative to the electron transport capability measured in milliamperes per square centimeter is greater than or equal to about −5 when the electrons are dominant in the emission layer.

4. The electroluminescent device of claim 1, wherein
the hole auxiliary layer comprises a first hole transport layer adjacent to the emission layer,
a highest occupied molecular orbital energy level difference between the first hole transport layer and the emission layer is greater than about 0.3 electronvolts.

5. The electroluminescent device of claim 4, wherein a hole mobility of the first hole transport layer is less than about 0.01 square centimeters per volt second.

6. The electroluminescent device of claim 4, wherein the first hole transport layer comprises a polymer having a substituted or unsubstituted fluorene moiety.

7. The electroluminescent device of claim 1, wherein the logarithmic value of the hole transport capability measured in milliamperes per square centimeter relative to the electron transport capability measured in milliamperes per square centimeter is greater than or equal to about 1 when the holes are dominant in the emission layer.

8. The electroluminescent device of claim 1, wherein the logarithmic value of the hole transport capability measured in milliamperes per square centimeter relative to the electron transport capability measured in milliamperes per square centimeter is less than or equal to about 4 when the holes are dominant in the emission layer.

9. The electroluminescent device of claim 1, wherein a content of an organic material of the emission layer is less than or equal to about 15 weight percent, based on a total weight of the emission layer.

10. The electroluminescent device of claim 9, wherein the emission layer further comprises a halogen.

11. The electroluminescent device of claim 9, wherein
the electron auxiliary layer comprises a first electron transport layer adjacent to the emission layer, and
an electron mobility of the first electron transport layer is less than or equal to about 0.01 square centimeters per volt second.

12. The electroluminescent device of claim 11, wherein the first electron transport layer comprises an organic material.

13. The electroluminescent device of claim 12, wherein the organic material comprises a compound comprising at least one polycyclic aromatic moiety, a heteroaromatic ring compound, or a combination thereof.

14. The electroluminescent device of claim 1, wherein the electron auxiliary layer comprises nanoparticles comprising zinc metal oxide.

15. The electroluminescent device of claim 14, wherein the zinc metal oxide comprises a compound represented by Chemical Formula 1:

$$Zn_{1-x}M_xO \qquad \text{Chemical Formula 1}$$

wherein, in Chemical Formula 1, M is Mg, Ca, Zr, W, Li, Ti, Y, Al, or a combination thereof, and $0 \leq x \leq 0.5$.

16. The electroluminescent device of claim 1, wherein the electroluminescent device is configured to have a life-span-luminance curve having a maximum.

17. The electroluminescent device of claim 16, wherein the maximum is at least 1.05 times as large as an initial luminance of the electroluminescent device.

18. The electroluminescent device of claim 1, wherein when the electroluminescent device is deteriorated to show about 40% of an initial luminance thereof, a photoluminescence intensity at a maximum peak wavelength of the electroluminescent device is less than or equal to about 0.5 relative to an initial value of a photoluminescence intensity of the electroluminescent device.

* * * * *